US009569037B2

(12) United States Patent
Yilmaz et al.

(10) Patent No.: US 9,569,037 B2
(45) Date of Patent: Feb. 14, 2017

(54) CAPACITIVE SENSING WITH LOW-FREQUENCY NOISE REDUCTION

(75) Inventors: Esat Yilmaz, Chandler's Ford (GB); Harald Philipp, Hamble (GB)

(73) Assignee: Atmel Corporation, San Jose, CA (US)

( * ) Notice: Subject to any disclaimer, the term of this patent is extended or adjusted under 35 U.S.C. 154(b) by 1574 days.

(21) Appl. No.: 12/466,192

(22) Filed: May 14, 2009

(65) Prior Publication Data

US 2009/0303203 A1  Dec. 10, 2009

Related U.S. Application Data

(60) Provisional application No. 61/054,222, filed on May 19, 2008.

(51) Int. Cl.
| | | |
|---|---|---|
| *G01D 5/241* | (2006.01) | |
| *G01D 5/24* | (2006.01) | |
| *G06F 3/044* | (2006.01) | |
| *G06F 3/041* | (2006.01) | |
| *H03K 17/955* | (2006.01) | |

(52) U.S. Cl.
CPC ............ *G06F 3/044* (2013.01); *G06F 3/0418* (2013.01); *H03K 17/955* (2013.01); *H03K 2217/960705* (2013.01)

(58) Field of Classification Search
CPC .............................. G01D 5/241; G01D 5/2405
USPC ................. 345/156, 173; 331/17; 178/18.01, 178/18.05–18.06, 18.03; 340/561, 657; 324/678, 658, 661, 686, 662, 672; 204/403.01; 377/19; 341/33, 143; 375/226; 348/308; 320/134; 200/600; 702/191; 382/240; 323/301
See application file for complete search history.

(56) References Cited

U.S. PATENT DOCUMENTS

| | | | |
|---|---|---|---|
| 6,452,514 B1 * | 9/2002 | Philipp | ........................... 341/33 |
| 7,031,886 B1 * | 4/2006 | Hargreaves | ................... 702/191 |
| 7,663,607 B2 | 2/2010 | Hotelling | |
| 7,864,503 B2 | 1/2011 | Chang | |
| 7,875,814 B2 | 1/2011 | Chen | |

(Continued)

FOREIGN PATENT DOCUMENTS

| | | |
|---|---|---|
| CN | 1702609 | 11/2005 |
| WO | WO-9723738 A1 | 7/1997 |

(Continued)

OTHER PUBLICATIONS

Second Office Action of China State Itellectual Property Office; Application No. 200910203416.2; 12 pgs including translation.

(Continued)

*Primary Examiner* — Lin Li
(74) *Attorney, Agent, or Firm* — Baker Botts L.L.P.

(57) ABSTRACT

A method of sensing the presence of a body from a change in an amount of charge present on a capacitively charged key. The method comprises inducing charge onto the key during a drive part of a measurement cycle, coupling a signal measurement capacitor to the key during a signal measurement part of the measurement cycle to the effect that the charge induced on the key during the drive part of the measurement cycle is transferred to the signal measurement capacitor, determining from a noise measurement part of the measurement cycle an amount of charge induced on the key by noise during the signal measurement part of the measurement cycle, and controlling the drive part, the signal measurement part and the noise measurement parts of the cycle to provide the charge sensing circuit with a measurement of the signal from which the noise induced on the key has been or can be substantially cancelled.

30 Claims, 13 Drawing Sheets

(56) References Cited

U.S. PATENT DOCUMENTS

| | | |
|---|---|---|
| 7,920,129 B2 | 4/2011 | Hotelling |
| 8,031,094 B2 | 10/2011 | Hotelling |
| 8,031,174 B2 | 10/2011 | Hamblin |
| 8,040,326 B2 | 10/2011 | Hotelling |
| 8,049,732 B2 | 11/2011 | Hotelling |
| 8,179,381 B2 | 5/2012 | Frey |
| 8,217,902 B2 | 7/2012 | Chang |
| 2005/0134292 A1* | 6/2005 | Knoedgen ............ 324/658 |
| 2006/0097991 A1* | 5/2006 | Hotelling et al. ........... 345/173 |
| 2007/0075710 A1* | 4/2007 | Hargreaves et al. ......... 324/658 |
| 2008/0041640 A1* | 2/2008 | Gillespie et al. ........ 178/18.01 |
| 2008/0116904 A1* | 5/2008 | Reynolds et al. ........... 324/678 |
| 2008/0309635 A1 | 12/2008 | Matsuo |
| 2009/0058389 A1* | 3/2009 | Yang et al. ................. 323/301 |
| 2009/0122173 A1* | 5/2009 | Tennant et al. .............. 348/308 |
| 2009/0127003 A1* | 5/2009 | Geaghan .................... 178/18.03 |
| 2009/0225036 A1* | 9/2009 | Wright ......................... 345/173 |
| 2009/0225044 A1* | 9/2009 | Jeon et al. ................... 345/173 |
| 2009/0303198 A1 | 12/2009 | Yilmaz et al. |
| 2009/0315854 A1 | 12/2009 | Matsuo |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2013/0076612 A1 | 3/2013 | Myers |

FOREIGN PATENT DOCUMENTS

| | | |
|---|---|---|
| WO | WO-0044018 | 7/2000 |
| WO | WO 2012/129247 | 9/2012 |

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.
State Intellectual Property Office (SIPO) of the People's Republic of China, Chinese First Office Action, Search Report, English Translation of text of the First Office Action, and English Translation of text of the Search Report, Chinese Patent Appl. No. 200910203416.2, dated Oct. 12, 2012.
Office Action of the Intellectual Property Office (IPO) of Taiwan and Search Report regarding Patent Application No. 098116594, filed May 19, 2009, and Translation of communication issued on Mar. 6, 2014 (reported on Apr. 3, 2014); including foreign and English versions.

* cited by examiner

CAPACITIVE SENSING WITH LOW-FREQUENCY NOISE REDUCTION

RELATED APPLICATIONS

This application claims the benefit under 35 U.S.C. 119(e) of U.S. Provisional Patent Application Ser. No. 61/054,222, filed on May 19, 2008, which is incorporated herein by reference in its entirety.

FIELD

The present invention relates to methods and apparatus for sensing the presence of a body from a change in an amount of charge present on a capacitively charged key. The present invention also relates to touch sensitive control panels which include a plurality of keys, which can be arranged in a matrix and can be used to form, for example, a two dimensional touch sensitive user input device.

In some embodiments a touch sensor includes a key comprising a drive plate and a sense plate, in which the key may be driven contemporaneously with charge measurement taking place or a charge signal may be measured after a key is driven during a measurement cycle.

BACKGROUND

Touch sensitive control devices are now prevalent on many electronic devices such as mobile phones, MP3 players, personal digital assistants as well as white goods such as cookers and freezers. This is because they are space saving in terms of an amount of "surface real estate" available to position user controls, robust in that there is a reduction in the amount of mechanical components required in their implementation and they can also be made to resist potentially harmful substances in an environment in which they are disposed. For the example of white goods, the presence of water and other aqueous substances is typically harmful to contact switches. Therefore, the touch sensitive switch can be disposed behind a protective layer preventing damage from being caused by the aqueous substances. Furthermore, a touch sensitive control can be disposed in front of a display screen such as for example an LCD display screen with the effect that a user can select a particular function by touching the screen at a position at which a particular menu option has been displayed.

There are various forms of touch sensitive controls which use a capacitive sensor to sense the presence of a body such as a user's finger. A touch sensitive capacitive sensor for example is disclosed in WO-97/23738. In WO-97/23738 a single coupling plate is provided and disposed to form a touch sensitive switch. The touch sensitive plate is referred to as a key. In accordance with this example, the key is charged using a drive circuit for a drive part of a measurement cycle and then this charge is measured by transferring the induced charge from the key by a charge detection circuit during a measurement part of the cycle. The charging and transferring parts of the cycle can vary widely and can be selected in accordance with the application concerned. The sensor can detect the presence of an object near the key as a result of a change in an amount of the charge induced onto the key, even in the presence of interfering substances.

Another form of touch sensitive control is disclosed in WO-00/44018. In this example a pair of electrodes are provided which act as a key so that the presence of a body such as a user's finger is detected as a result of a change in an amount of charge which is transferred between the two electrodes. With this arrangement, one of the pair of electrodes (labelled X) is driven with a drive circuit and the other of the pair of electrodes (labelled Y) is connected to a charge measurement circuit which detects an amount of charge present on the Y plate when driven by the X plate. As disclosed in WO-00/440018 several pairs of electrodes can be arranged to form a matrix of sensing areas which can provide an efficient implementation of a touch sensitive two-dimensional position sensor. Such two dimensional capacitive sensors are typically used with devices which include touch sensitive screens or touch sensitive keyboards/keypads which are used in the example of consumer electronic devices and domestic appliances. As indicated above, such two dimensional capacitive touch sensors can be used in conjunction with liquid crystal displays or cathode ray tubes to form such touch sensitive screens.

Although touch sensitive capacitive sensors, such as those described above and disclosed in the above-mentioned disclosures, have been successfully deployed in many applications, some applications can present a challenging environment for detecting a change in charge as a result of the presence of a body. For example, noise which may be present for a particular application can cause a disruption in accurately measuring an amount of charge transferred from a capacitively charged key for the various examples set out above.

SUMMARY

According to the present invention there is provided a method and apparatus for sensing the presence of a body from a change in an amount of charge present on a capacitively charged key. The method finds application for an example in which a key comprises a single plate which is charged first and then discharged, and for an example in which the key includes a drive plate X and a receiving plate Y, in which the amount of charge received on the Y plate is determined contemporaneously with the drive plate being charged by a drive voltage. The present invention also finds application in an example in which a plurality of key pairs form a key matrix.

The method comprises inducing charge onto the key during a drive part of a measurement cycle, coupling a signal measurement capacitor to the key during a signal measurement part of the measurement cycle to the effect that the charge induced on the key during the drive part of the measurement cycle is transferred to the signal measurement capacitor, determining from a noise measurement part of the measurement cycle an amount of charge induced on the key by noise during the signal measurement part of the measurement cycle, and controlling the drive part, the signal measurement part and the noise measurement parts of the cycle to provide the charge sensing circuit with a measurement of the signal from which the noise induced on the key has been or can be substantially cancelled.

Embodiments of the present invention can provide a method and apparatus for improving an accuracy with which a signal measurement is taken from a capacitively charged key, and in particular for providing a way of removing or at least reducing the effects of noise, which may otherwise cause an erroneous reading to be made. In one example, the determining an amount of charge induced on the key by noise, includes coupling a noise measurement capacitor to the key for the noise measurement part of the measurement cycle either after the charge induced by the key has been transferred to the signal measurement capacitor or before the charge has been induced on the key during the drive part of the measurement cycle. The charge induced on the key may be transferred to the signal measurement capacitor by coupling the signal measurement capacitor to the key contemporaneously with the drive part of the measurement cycle to the effect that the charge induced on the key is transferred to the signal measurement capacitor during the signal measurement part of the measurement cycle, and determining an amount of charge present on the signal measurement capacitor.

In another example, the determining the amount of charge induced on the key by the noise, includes coupling the signal measurement capacitor to the key contemporaneously with the drive part of the cycle to the effect that the charge induced on the key is transferred to the signal measurement capacitor, and the determining from the noise measurement part of the measurement cycle the amount of charge induced on the key by the noise, includes either before the drive part of the measurement cycle or after the signal measurement part of the measurement cycle coupling the signal measurement capacitor to the key in reverse so that charge induced by noise on the key reduces the amount of charge induced on the measurement capacitor during the signal measurement part of the cycle.

In some embodiments a time period of the signal measurement part and the noise measurement part of the cycle are substantially equal. As such a contribution made by the noise during the signal measurement part of the measurement cycle will be represented by a sample of the noise determined from the noise measurement part of the measurement cycle, without any adjustment, scaling or adaptation. On the other hand, if the time period of the noise measurement part of the measurement cycle is different to the signal measurement part of the measurement cycle, then the noise measurement can be scaled in proportion with the difference in the time periods of the signal and noise measurement parts of the cycle. In some embodiments the noise measurement part of the measurement cycle includes a first period before the signal measurement part of the cycle and a second period after the signal measurement part of the cycle. As a result, if the noise is low frequency noise, then the average noise measurement taken between the first and second parts of the noise measurement part of the measurement cycle will provide a more accurate estimate of the amount of charge induced by the noise during the signal measurement part of the measurement cycle.

In some examples, in order to reduce a dwell time, inducing the charge onto the key during the drive part of the measurement cycle occurs before the coupling of the signal measurement capacitor to the key during the signal measurement part of the measurement cycle to the effect that the key is pre-charged before the charge induced on the key is transferred to the signal measurement capacitor. The dwell time is a time required to allow the charge transferred from the key to reach a steady state value.

Various further aspects and features of the present invention are defined in the appended claims.

BRIEF DESCRIPTION OF THE DRAWINGS

Example embodiments of the present invention will now be described by way of example only with reference to the accompanying drawings in which like parts are referred to by like reference numerals and in which.

DETAILED DESCRIPTION

Figure 1A:
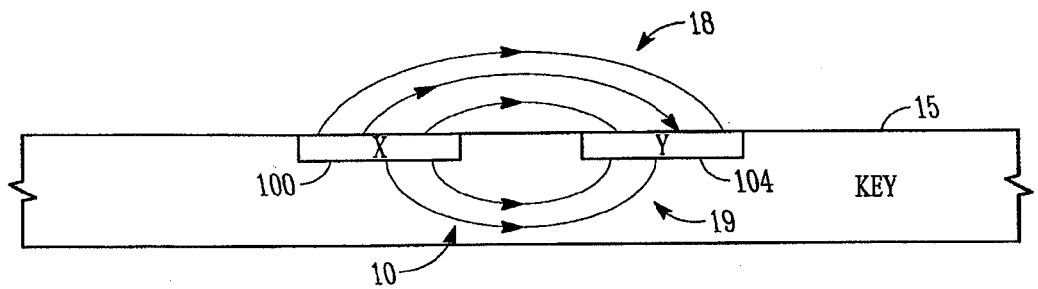
FIG. 1A is a schematic block diagram providing an example of a touch sensitive sensor.
Figure 1B:
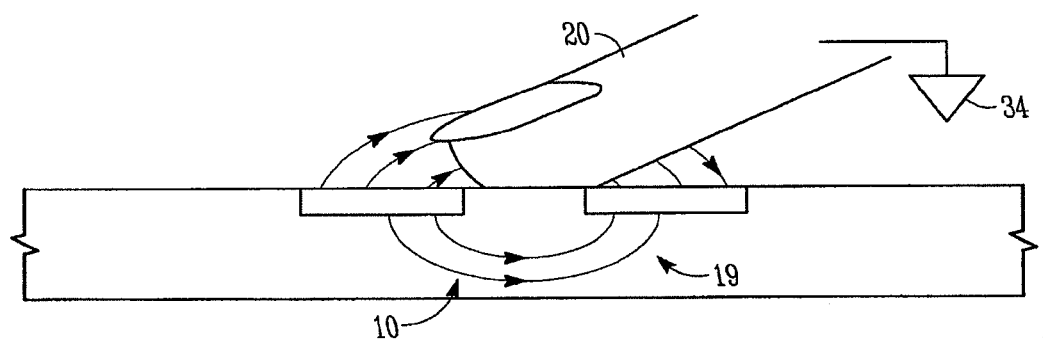
FIG. 1B is an example illustration of a user's finger disposed proximate the sensor.

As explained above there are various forms of touch sensors which can determine the presence of a body proximate the touch sensor as a result of a change of charge transferred from a key of the touch sensor. An example of such a touch sensor is shown in FIGS. 1A and 1B. The example shown in FIGS. 1A and 1B correspond to an example in which a pair of electrodes form a touch sensor. As shown in FIG. 1A a pair of electrodes 100, 104 which form a drive or X plate and a receiving or Y plate in the following description are disposed beneath the surface of a touch sensitive control panel 15. As shown in FIGS. 1A and 1B the touch sensor 10 is arranged to detect the presence of a body such as a user's finger 20 as a result of a change in an amount of charge transferred from the Y plate 104. As shown in FIG. 1A when the X plate 100 is charged or driven by a circuit, an electric field is formed which is illustrated by the lines 18 and 19 both above and below the touch panel surface 15 as a result of which charge is transferred to the Y plate 104. The X plate and the Y plate 100, 104 form a capacitively charged key 10. As shown in FIG. 1B as a result of the disturbance of the electric field 18 due to the presence of the user's finger 20 the electric field above the surface of the control panel 15 is disturbed as a result of an earthing or grounding effect provided by the user's finger 20 as illustrated schematically by a ground symbol 34.

Figure 2:
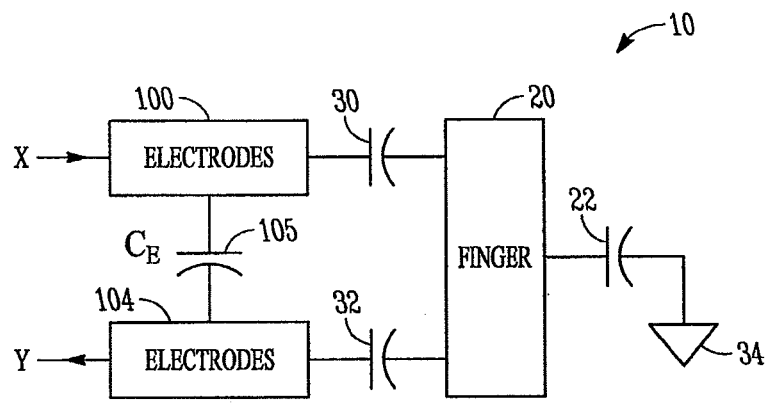
FIG. 2 is a schematic block diagram illustrating an electrical equivalent of the touch sensor shown in FIG. 1B.

An equivalent circuit diagram of the touch sensor shown in FIGS. 1A and 1B is shown in FIG. 2. In FIG. 2 equivalent capacitances are illustrated in the form of a circuit diagram. A capacitance formed between the X plate and the Y plate of the key 100, 104 is a capacitance $C_E$ 105. The presence of the body 20 has an effect of introducing shunting capacitances 30 and 32, which are then grounded via the body 20 by an equivalent grounding capacitor 22 to the ground 34. Thus the presence of the body 20 affects the amount of charge transferred from the Y plate of the key and therefore provides a way of detecting the presence of the body 20.

Figure 3:
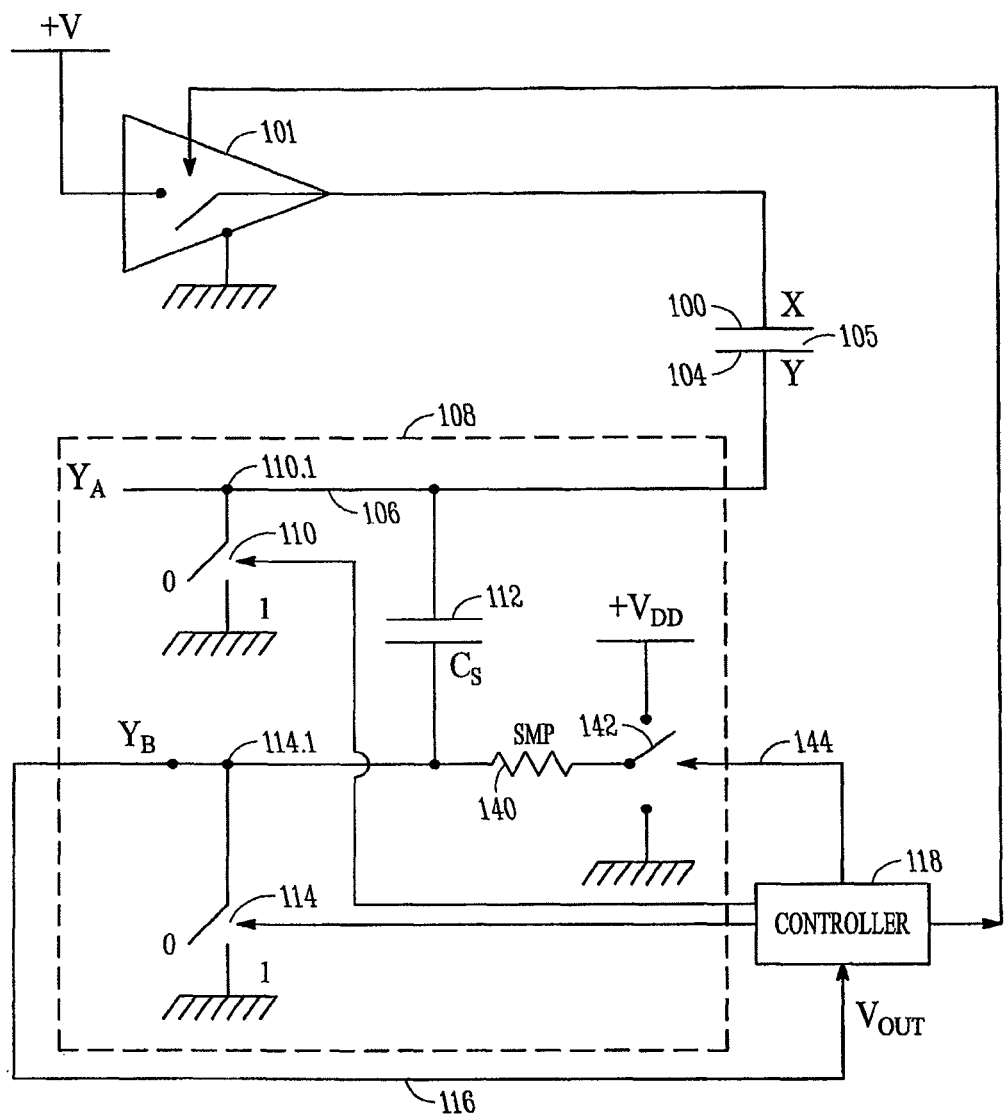
FIG. 3 is a schematic block diagram of a circuit which in combination with the touch sensor shown in FIG. 1B serves to form a touch sensor.

FIG. 3 provides an example circuit diagram which forms a touch sensor by sensing an amount of charge transferred from the X plate 100 shown in FIG. 2 to the Y plate 104 and includes a charge measurement circuit which has been reproduced from WO-00/44018 in order to assist in the illustration of example embodiments of the present invention.

As shown in FIG. 3 a drive circuit 101 is connected to the X plate of the key 100 and the Y plate of the key 104 is connected to an input 106 of a charge measurement circuit 108, wherein the X and Y plates collectively form the capacitor 105. The input 106 is connected to a first controllable switch 110 and to one side of a measuring capacitor $C_S$ 112. The other side of the measurement capacitor 112 is connected via a second switch 114 to an output 116 of the measurement circuit 108 which is fed as a voltage $V_{OUT}$ to a controller 118. In the circuit diagram shown in FIG. 3 a convention has been adopted to show that a control input of each of the switches 110, 114 is open for the control input "0" and closed for the control input "1". The other side of each of the switches 110, 114 is connected to ground, so that if the control input is "1" then the connecting input would be connected to ground. The operation of the touch sensor shown in FIG. 3 including the function of the measurement circuit which is arranged to measure an amount of charge transferred from the X plate to the Y plate of the key 104 will now be explained with reference to the timing diagram shown in FIG. 4.

Figure 4:
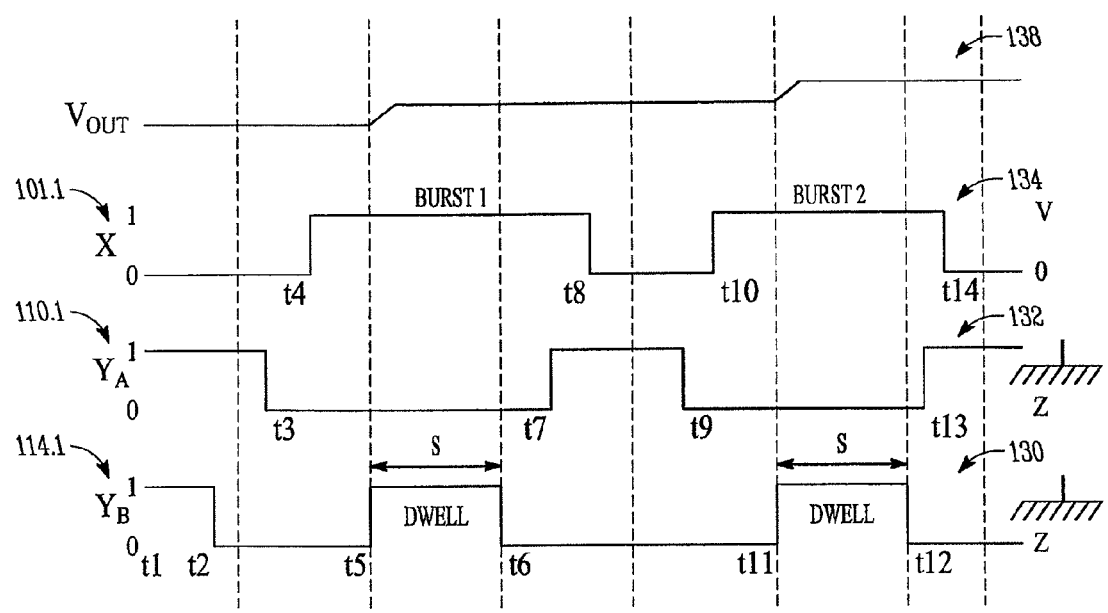
FIG. 4 is an example timing diagram illustrating the operation of the sensing circuit shown in FIG. 3.

In FIG. 4, four timing diagrams 130, 132, 134, 138 are shown to illustrate the operation of the measurement circuit 108 shown in FIG. 3. A first timing diagram 130 represents the control input applied to the second switch 114. Thus, on the left hand side, the logical value of the control input is shown, whereas on the right hand side the effect at the connecting point 114.1 is shown to be either "Z" in which the connecting point 114.1 is isolated or floating, or for a logical control input of 1 grounded. Similarly a timing diagram 132 illustrates for logical control input values "0" or "1" of a connecting point 110.1 at either floating (Z) or ground (0). A third timing diagram 134 shows a relative timing of a drive signal provided to the X plate 100 of the key in which case, in contrast to the timing diagrams 130, 132 for the two switches 110, 114, the value of the timing diagram is an absolute value so that the left hand side illustrates that the voltage varies between 0V and the reference voltage V, which is the voltage used to charge the X plate 100. The final timing diagram 138 provides an illustration of the example signal strength or voltage produced on the measurement capacitor 112 as a result of the opening and closing of the switches 110, 114 and the driving of the X plate 100 in accordance with the timing illustrated by the timing diagrams 130, 132, 134. The timing diagrams 130, 132, 134, 138 will now be explained as follows:

In FIG. 4 at a first point t1, the charge measurement circuit 108 is initialized with both the control inputs for the switches 110, 114 being high (1) so that both the Y plate and the charge measurement capacitor 112 are set to ground and the X plate 100 of the key is at zero and therefore not being driven by the drive circuit 101. Correspondingly, the output voltage across the charge measurement circuit 112 is at zero. At t2 the logical input to the control switch 114 is set to zero thereby opening the switch and floating the connecting point 114.1, which connects the output voltage 116 to one side of the measurement capacitor 112.

At a next time t3 the control input to the switch 110 is set low (0) thereby floating the connecting point 110.1 which is $Y_A$ before at a time t4 the drive circuit 101 drives the X plate of the key 100 to the reference voltage V. Then in order to charge the measurement capacitor $C_S$ for a period S between t5 and t6, the control input to the switch 114 is set high (1) thereby grounding $Y_B$ to transfer charge induced on the Y plate of the key 104 onto the charge measurement capacitor 112, until t6 when the control input to the switch 114 is set to low (0), which again floats the connecting point 114.1. After charging the measurement capacitor $C_S$ for a first dwell time between t5 and t6, at t7 the control input to switch 110 is set high (1), thereby grounding the connecting point 110.1, which is connected to the other side of the charge measurement capacitor $C_S$ 112. As a result, the voltage across the measurement capacitor can be measured. The amount of charge transferred from the Y plate 104 onto the measurement capacitor $C_S$ 112 during the dwell time between t5 and t6 is represented as the output voltage $V_{OUT}$.

At t8 the drive circuit 101 goes low (0), which concludes a first measurement burst.

At t9 the next measurement cycle of a measurement burst occurs. At t9 the control input to the switch 110 goes low (0) thereby floating $Y_A$, before the drive circuit again drives the X plate 100 with a voltage "V", at time t10. The measurement capacitor 112 is again charged from charge transferred from the Y plate 104 of the key onto the measurement capacitor 112. As with the first burst at point t11 the control input to the switch 114 goes high (1) thereby grounding the point 114.1 and driving charge onto the measurement capacitor until t12, when the control input to the switch 114 goes low, again floating $Y_B$. Thus again charge is transferred from the Y plate 104 during the dwell period between t11 and t12, thereby increasing the voltage across the measurement capacitor $C_S$ as represented as the output voltage $V_{OUT}$. At t13 the control input to the switch 110 is set high (1) thereby grounding $Y_A$ and at t14 the drive circuit 101 goes low (0), which concludes the second measurement burst. Thus, as with the first burst an amount of charge has been transferred from the Y plate, which has then increased the voltage across the measurement capacitor 112, which represents an amount of charge transferred from the Y plate.

After several bursts the amount of charge present on the Y plate transferred to the measurement capacitor 112 is consistent, thereby providing a representation of charge present on the key produced by the drive signal to the X plate 100 via the drive circuit 101. The amount of charge on the measurement capacitor 112 is determined with the aide of a discharge resistor 140. One side of the discharge resistor 140 is connected to the measurement capacitor and the other side SMP is connected to a discharge switch 142. The discharge switch 142 receives a control signal from the controller 118 via a control channel 144. The controller 118 is controlled so as to ground SMP, during measurement bursts and to discharge the measurement capacitor $C_S$ 112 through the discharge resistor 140 by connecting SMP to a voltage $V_{DD}$. The controller 118 then determines an amount of charge present by counting a number of predetermined clock periods before the charge on the measurement capacitor $C_S$ is discharged to zero. The number of clock periods therefore provides a relative signal sample value for the respective measured charge signal.

In alternative embodiments, instead of arranging for the controller 118 to generate a predetermined number of measurement bursts and then measuring the charge present on the Y plate, the controller may operate to continue with the measurement bursts until a predetermined threshold voltage is reached. The number of measurement bursts required to reach the predetermined threshold then provides an indication of the amount of charge transferred from the X plate to the Y plate and therefore an indication of the electric coupling between them. Hence the presence of a body proximate the coupling will change the electric coupling and therefore the number of bursts required to reach the threshold, which can therefore be detected by the controller.

As explained in WO-00/44018 a charge subtraction capacitor is provided to subtract charge from the Y plate of the key 104 and the measurement capacitor to ensure that there is a linear transfer of charge onto the measurement capacitor 112 to provide an accurate measurement. Further explanation is therefore provided in WO-00/44018 the content of which is incorporated herein by reference.

One advantage of the measurement circuit shown in FIG. 3 is that, using the same principles of construction and operation, a matrix of touch sensitive switches can be formed, so that a user can select either a plurality of different positions on a touch sensitive screen, for example, or a plurality of different functions in dependence upon the position of the user's finger for example with respect to the matrix of points. For example, FIG. 5 has been largely reproduced from WO-00/44018.

Figure 5:
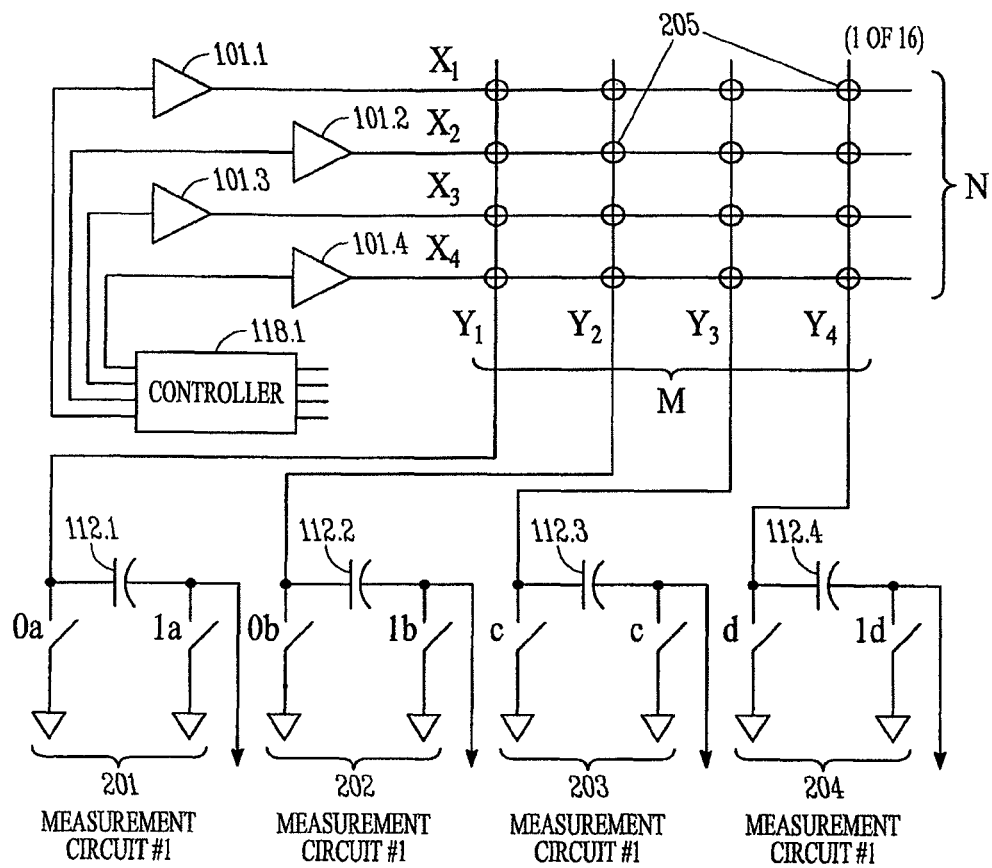
FIG. 5 is a schematic block diagram illustrating a touch sensitive matrix providing a two-dimensional capacitive transducing sensor arrangement.
Figure 6:
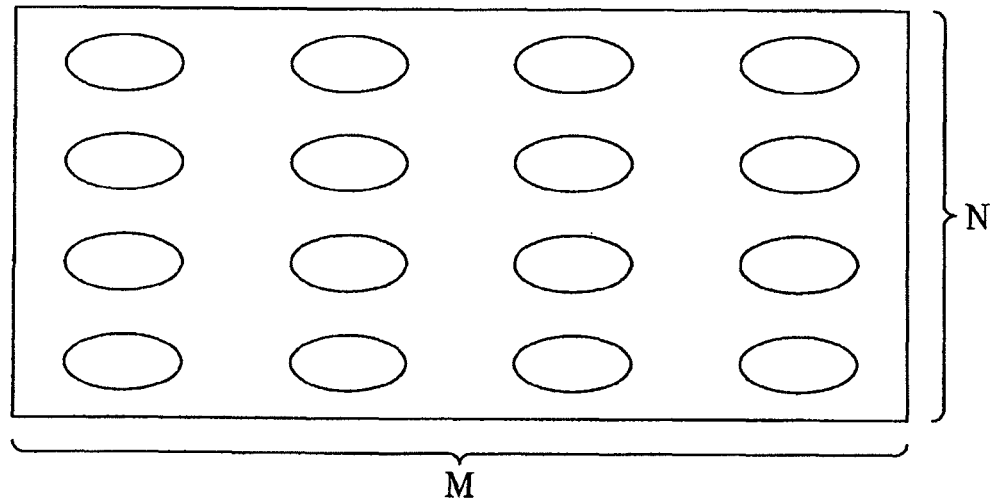
FIG. 6 is a schematic illustration showing an application of the two-dimensional capacitive transducing sensor shown in FIG. 5.

In FIG. 5 drive circuits 101.1, 101.2, 101.3, 101.4 are arranged to drive different sensor points 205 which with example shown in FIG. 5 forms an N=4×M=4 array. Thus, as shown correspondingly in FIG. 6 a control panel with sixteen touch sensitive points is provided which can be used to either form the touch sensitive screen or a control panel with multiple selection control switches.

As shown in FIG. 5 each of the drive circuits 101.1, 101.2, 101.3, 101.4 is controlled by controller 118.1 to drive each of the corresponding lines X1, X2, X3, X4 in the same way as the X plate 100 is driven in FIG. 3 and represented in FIG. 4. The output of the coupling capacitor at each of the points 205 are connected to one side of measuring capacitors 112.1, 112.2, 112.3, 112.4 which are arranged to measure an amount of charge present on the Y plate Y1, Y2, Y3, Y4 providing output signals 116.1, 116.2, 116.3, 116.4 to detect the presence of an object in the same way as the operation of the circuit shown in FIG. 3 and FIG. 4. More details for the operation of such a matrix circuit are disclosed in WO-00/44018.

Although the touch sensor described above with reference to FIGS. 1 to 6 provides an effective touch sensor which can be used for many applications, there is a desire to use such touch sensors in increasingly challenging environments. For example, the use of a touch sensor on a mobile phone can create a technical problem because there is a variety of disturbing noise signals produced by radio frequency radiation by radio frequency signals and by modulators within the mobile phone. Similarly, on a television, switching noise as a result of switching LCD displays and pixels within the display on and off can produce rectangular noise. Sinusoidal noise, such as that produced by sinusoidal electricity may also be present, which can affect the amount of charge detected on a key. An example of low frequency noise is shown in FIG. 7.

Figure 7:
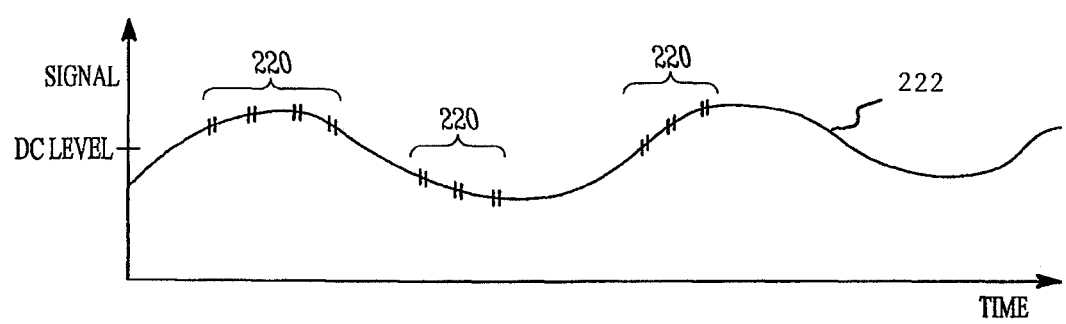
FIG. 7 is a graphical illustration showing a plot of signal strength with respect to time representing a voltage or charge present on a sensing key which has been affected by sinusoidal noise, such as sinusoidal noise.

In FIG. 7 a plot is shown of signal strength or amplitude which may be voltage or charge measured with respect to time. As shown in FIG. 7 various points 220 are shown to indicate points at which burst measurements are taken for a touch sensor such as those shown in FIGS. 4 and 5. As will be appreciated, as a result of sinusoidal noise represented by a line 222, an amount of charge transferred from a key by a measurement capacitor of the measurement circuit (such as those shown in FIGS. 3 and 5) will vary and therefore could in some circumstances cause a false measurement of the presence of a body.

Figure 8:
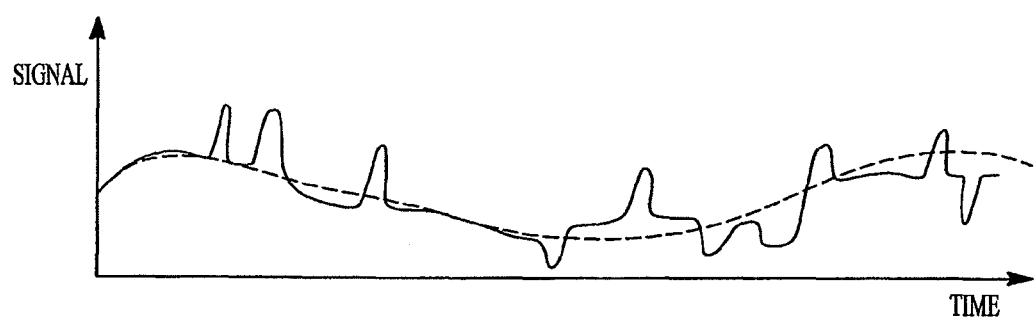
FIG. 8 is a graphical representation of signal strength with respect to time for a combination of the sinusoidal noise shown in FIG. 7 and higher frequency noise.

As will be appreciated, in some examples, both sinusoidal noise and rectangular noise will be present so that the plot of signal amplitude with respect to time for a combination of sinusoidal noise shown in FIG. 7 and switching noise is as shown in FIG. 8. Thus, as will be appreciated in some example embodiments a technique for obviating or at least reducing the effects of sinusoidal or mains noise and a technique for obviating or at least reducing the effects of switching noise with higher frequency components, which is disclosed in co-pending U.S. application Ser. No. 12/466, 230, can be combined together to improve a likelihood of correctly detecting the presence of a body proximate the touch sensitive sensor key in the presence of both sinusoidal noise and switching noise.

Figure 9:
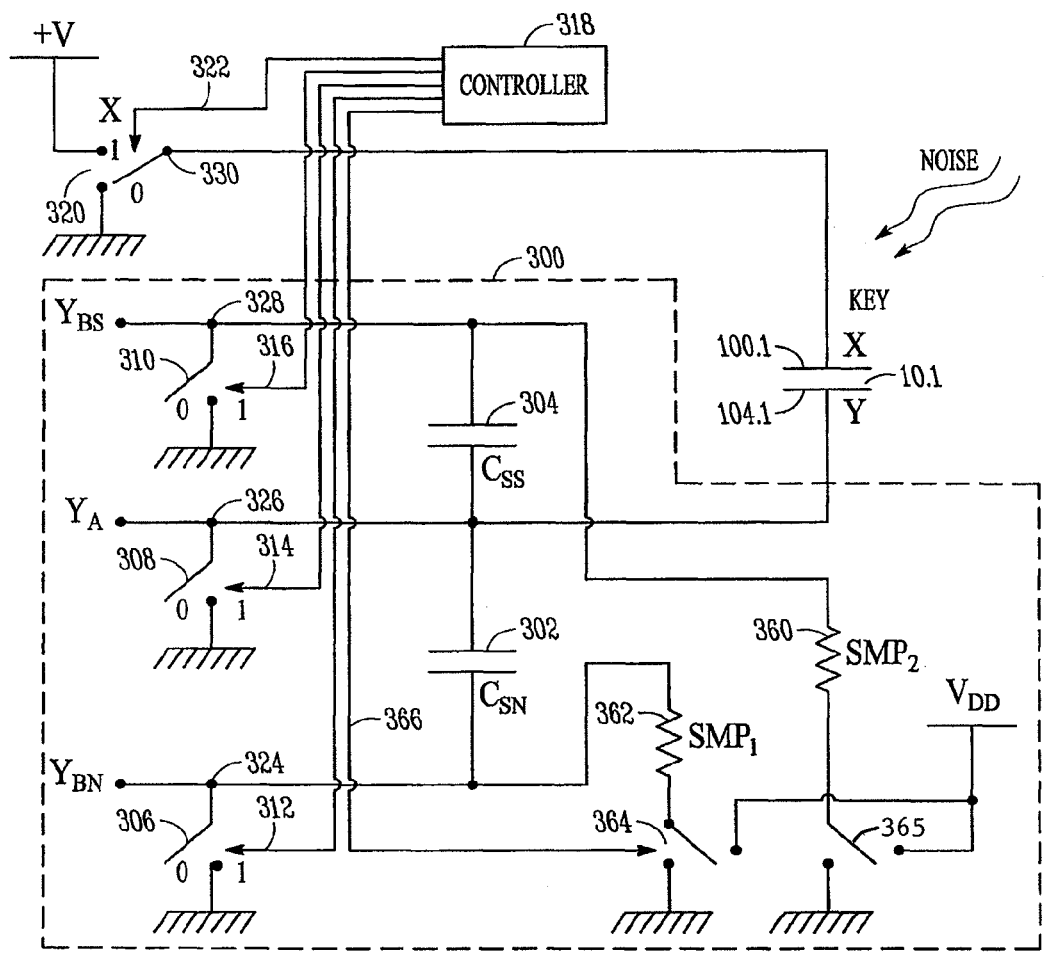
FIG. 9 is a schematic block diagram of a circuit including a charge measurement part in accordance with an example of the present technique.

An example embodiment of the present invention which is arranged to reduce the effects of sinusoidal noise on a touch sensor is shown in FIG. 9. In FIG. 9 a key forming a touch sensor 10.1 includes an X plate 100.1 and a Y plate 104.1. The key is arranged to detect the presence of a body proximate the charge sensor in the way explained above with reference to FIGS. 1 to 6. In order to reduce the effects of sinusoidal noise on the key 10.1 a measurement circuit 300 is provided, which includes a first measurement capacitor 302 referred to as $C_{SN}$ for measuring noise and a second measurement capacitor 304 referred to as $C_{SS}$ for measuring the signal and noise present on the key. The measurement circuit also includes switches 306, 308, 310 having respective logical inputs 312, 314, 316, which are each controlled by a controller 318, which may be embodied with a micro-controller. There is also a switch 320, which performs the operation of the drive circuit 101 as shown in FIGS. 3 and 5. The switch 320 has a logical control input 322 also connected to the micro-controller 318. Nodes 324, 326, 328, 330 adjacent respective switches 306, 308, 310, 320 are also indicated as well as discharge resistors 360, 362 for discharging capacitors $C_{SS}$ and $C_{SN}$ and associated switches 364, 365, which are controlled by the micro-controller 318. As for the description of the measurement circuit shown in FIG. 3, a convention has been adopted such that if the logical control inputs 312, 314, 316, 322 are low (0) then the switch is open and if the logical control input is high (1) then the switch is closed. The operation of the touch sensor shown in FIG. 9 will now be described with reference to FIGS. 10, 11 and 12.

Figure 10:
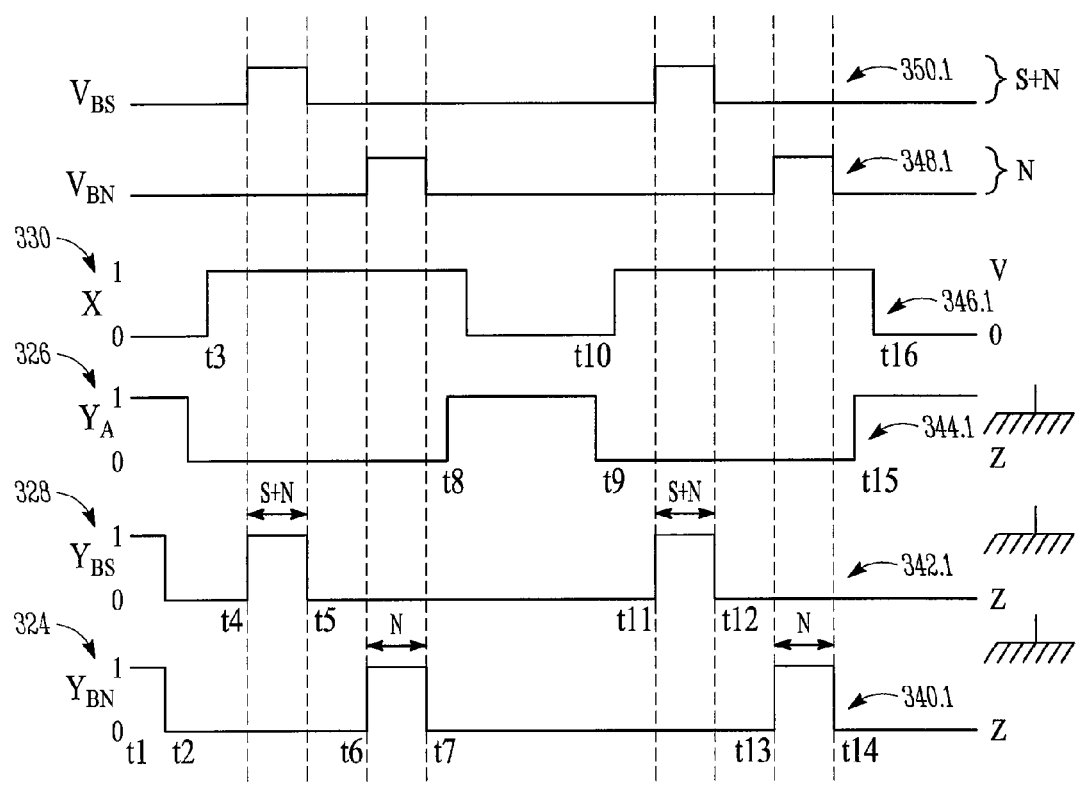
FIG. 10 is a graphical representation of a timing diagram illustrating one example operation of the measurement circuit shown in FIG. 9.

FIG. 10 shows six timing diagrams according to an example operation of the touch sensor shown in FIG. 9 in which four measurements are performed, two for signal plus noise and two for noise only. A first of the timing diagrams 340.1 represents the electrical value at a connecting point 324 or $Y_{BN}$ on the switch 306. A second of the timing diagrams 342.1 represents an electrical value at a connecting point 328 or $Y_{BS}$ on the switch 310. A third of the timing diagrams 344.1 represents the electrical value at a connecting point 326 or $Y_A$ on the switch 308. A fourth timing diagram 346.1 represents the electrical value at a connecting point 330 or X on the switch 320. Fifth and sixth timing diagrams 348.1, 350.1 represent the output voltage taken across the noise measurement capacitor 302 and the signal measurement capacitor 304 respectively. Thus, the output voltages across the noise measurement capacitor $C_{SN}$ is taken between terminals $Y_A$ and $Y_{BN}$ and the signal measurement voltage $V_{BS}$ across the signal measurement capacitor $C_{SS}$ is taken between the terminals $Y_A$ and $Y_{BS}$ shown in FIG. 9. The timing diagram shown in FIG. 10 will now be explained as follows:

At a first time t1 switches 306, 308, 310 are all closed (1) grounding connecting points 324, 326, 328. Moreover, the switch 320 for operating the drive circuit 101 is 0 thereby also grounding the input to the X plate 100.1. As such, time t1 represents an initialization or reset of the touch sensor.

At time t2 the logical inputs to switches 306, 308, 310 are all set low (0) thereby floating the connecting points 324, 328, 326.

At time t3, in a first part of the measurement cycle, the X drive plate 100.1 of the key 10.1 is driven high by applying a logical high value (1) to the control input 322, in preparation for driving the charge onto the measurement capacitor $C_{SS}$. This step will be referred to as pre-charging X or the drive plate of the key, and has an advantage that it reduces dwell time, which is the time required to ensure that charge, which is transferred from the key has settled to a steady state value on the measurement capacitor $C_{SS}$, thereby allowing a faster measurement cycle. A faster measurement cycle can be used to provide a more responsive touch sensor.

At time t4 the logical input 326 to the switch 310 is set high (1), thereby grounding the connecting point 328 ($Y_{BS}$) which is one side of the measurement capacitor 304. The grounding of the measurement capacitor $C_{SS}$ has an effect of transferring the charge, which has been induced on the Y plate 104 of the key onto the measurement capacitor $C_{SS}$ following the principles already described with reference to FIGS. 1 to 6.

Between times t4 and t5 charge induced onto the Y plate 104.1 is transferred onto the measuring capacitor 304 because connecting point 328 is driven to ground by the switch 310 being closed. At t5 the logical input 316 to the switch 310 is driven low (1) thereby floating the connecting point 328 which ends measurement of the signal plus noise on the key 10.1.

At time t6 with $Y_A$ and $Y_{BS}$ floating the logical input to switch 306 is driven high (1), thereby grounding $Y_{BN}$, which is one side of the noise measurement capacitor $C_{SN}$ 302. Between times t6 and t7 noise induced in the Y plate 104.1 of the key 10.1 is transferred to the noise measurement capacitor $C_{SN}$ because the charge induced onto the Y plate by the drive signal 346.1 has already been transferred to the signal measurement capacitor 304.

At time t7 the switch 306 opens with a low signal (0) on the logical input channel 312. One side of the noise measuring capacitor 302 $C_{SN}$ is then floating which completes the noise measurement signal collection.

Between times t2 and time t8 a connecting input 314 to the switch 308 is driven low (0) thereby floating $Y_A$ so that charge can be transferred onto the signal measuring capacitor 304 and then the noise measurement capacitor 302. Thus, setting the logical input 314 high (1) at time t8 grounds $Y_A$ thereby ending the measurement cycle. At t8 therefore a potential difference between $Y_A$ and $Y_{BN}$ (connecting points 326 to 324) represents an amount of noise induced on the key as a result of charge accumulated on the measurement capacitor 302. Similarly, with the grounding of $Y_A$ (connecting point 326) an amount of charge transferred onto the measurement capacitor 304 following the signal $C_{SS}$ represents an amount of signal plus noise present on the key. Accordingly, as shown in the upper timing plots 348.1 to 350.1 for the measurement voltages, voltage values are shown, which are proportional to the noise only and signal plus noise respectively.

At time t9 the logical input 314 to the switch 308 is set low (0), thereby floating $Y_A$.

At time t10 the drive circuit represented by the switch 320 is driven high by logical input 330 thereby driving the X plate 100.1 with a voltage V which causes the measuring capacitor 304 to charge via the Y plate 104.1. This is a pre-charging of the X plate, which reduces the dwell time, in preparation for the next measurement cycle which again starts at t11 where a logical input 316 to switch 310 is driven high (1), thereby grounding $Y_{BS}$, which is the other side of the signal measurement capacitor 304.

Again, there is a period in which the measuring capacitor 304 is charged by charge transferred from the Y plate 104.1 of the key between t11 and t12 when the switch 310 opens as a result of a logical zero applied to the control input 316. Similarly, as with time points t6 and t8 time points t13 and t14 define a period where a logical one is applied to the control input 112 of the switch 306 thus grounding $Y_{BN}$, so that the measuring capacitor $C_{SN}$ is charged by noise present on the key. At time point t15 the switch 308 is closed thereby grounding $Y_A$, and at point t16 the X plate 100.1 is grounded so that a voltage is presented across the signal measuring capacitor 304 and the noise measuring capacitor 302, which provide a stable value as a result of a second dwell period on both the noise and the signal capacitors 302 and 304.

Thus as can be appreciated from the operation of the circuit which forms part of the touch sensor shown in FIG. 9, FIG. 10 provides an illustration of double dwell example where the signal is measured first.

As explained above for the touch sensor shown in FIGS. 3 and 4, one technique for measuring the charge value on the signal measurement capacitor $C_{SS}$ 304 and the noise measurement capacitor $C_{SN}$ 302 is to discharge each of the capacitors through respective discharge resistors 360, 362. The discharge resistors 360, 362 are respectively connected to ground, during charging and connected to $V_{DD}$ when discharging. The charging and discharging is arranged using the control switches 364, 365, which receive a control signal from the controller 318 via a control channel 366. Thus the controller respectively discharges each of the signal measurement capacitor $C_{SS}$ 304 and the noise measurement capacitor $C_{SN}$ 302 via the corresponding discharge resistors 360, 362 respectively by controlling the switches 364, 365 and determines an amount of charge present on each, by counting a number of predetermined clock periods before the charge is discharged to zero. The number of clock periods therefore provides a relative signal sample value for the respect signal and noise samples. The micro-controller 318 can then adjust the value of the signal plus noise, by applying the noise value from the signal plus noise value to get a more accurate measurement of the signal caused by the charge being transferred from the Y plate of the key 10.1. The presence of the noise may produce a positive or negative effect on the value of the signal plus noise, so that if the noise produces a positive charge, then the signal plus noise charge is reduced, whereas if the noise produces a negative charge, then the signal plus noise is increased in accordance with the value of the noise charge.

It will be appreciated from the explanation provided above that other parts may be applied to the measurement circuit 300, shown in FIG. 9 such as a charge subtraction circuit which is described in WO-00/44018.

In alternative embodiments, instead of arranging for the controller 318 to generate a predetermined number of measurement bursts and then measuring the charge present on the Y plate, the controller may operate to continue with the measurement bursts until a predetermined threshold voltage is reached. The number of measurement bursts required to reach the predetermined threshold then provides an indication of the amount of charge transferred from the X plate to the Y plate and therefore an indication of the electric coupling between them. Hence the presence of a body proximate the coupling will change the electric coupling and therefore the number of bursts required to reach the threshold, which can therefore be detected by the controller.

Figure 11:
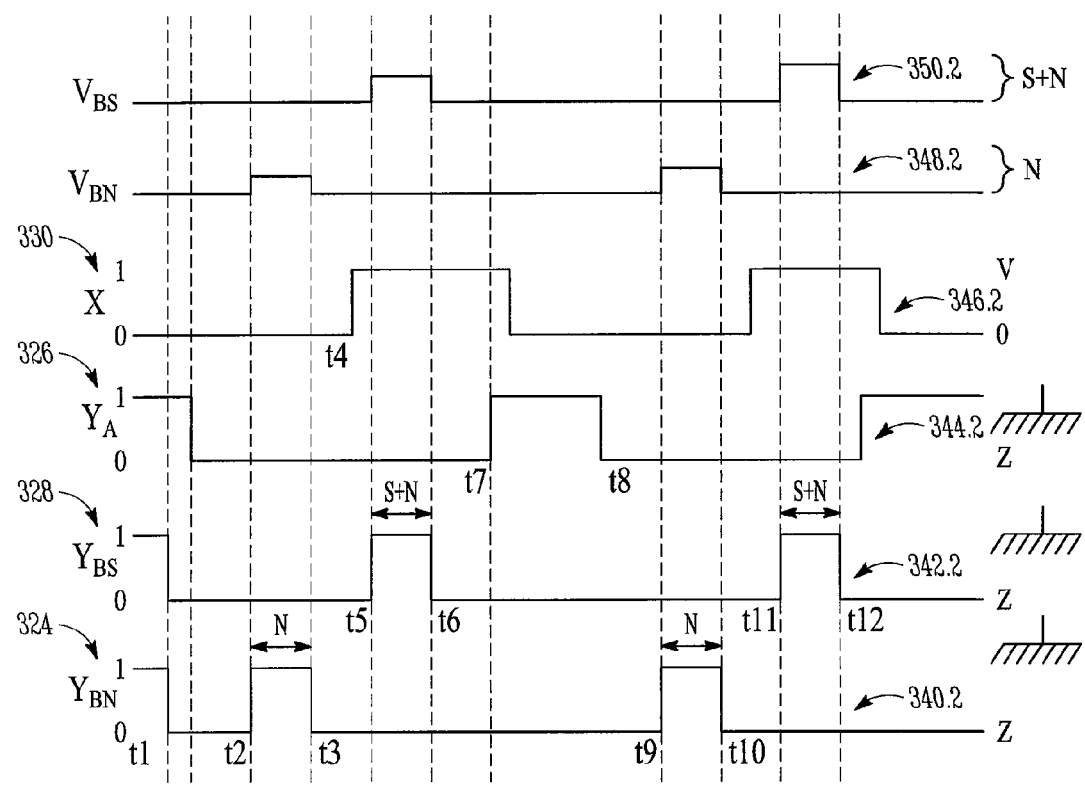
FIG. 11 is a graphical representation of a timing diagram for a second example operation of the measurement circuit shown in FIG. 9.

A second example of an operation of the measurement circuit 300 of the touch sensor shown in FIG. 9 is presented in FIG. 11. In FIG. 11 there is again a double dwell shown for both signal plus noise and noise only. However, in contrast to the example shown in FIG. 10 the noise measurement period occurs first. In FIG. 11, four timing diagrams are shown. A first timing diagram 340.2 provides a logical example of the control input 312 of the switch 306, a second timing diagram 342.2 represents the logical value of the control input 316 of the switch 310, a third timing diagram 344.2 represents a logical value of the control input 314 to the switch 308 and a fourth timing diagram 346.2 represents the logical value of the control input 322 to the switch 320 representing the operation of the drive circuit 101. Also shown in FIG. 11 is a value of an output voltage signal between $Y_A$ and $Y_{BN}$ 348.2 and an output voltage signal between $Y_A$ and $Y_{BS}$ 350.2 to represent the output measurements of noise and signal plus noise as for the example illustrated in FIG. 10. The timing diagram shown in FIG. 11 operates correspondingly to those shown in FIG. 10. However, since the noise measurement takes place first then after the initialization at time t1 the switch 306 is closed between t2 and t3 grounding $Y_{BN}$ therefore driving any noise induced onto the Y plate 104.1 onto the charge noise measurement capacitor 302 before the drive signal X is applied to the X plate by closing the switch 320 at t4. As before, the X plate is pre-charged to reduce the dwell time when $Y_{BS}$ 350.2 is grounded and the signal measurement capacitor 304 is being charged. As for the example shown in FIG. 10 between times t5 and t6 the switch 310 is closed to ground $Y_{BS}$ whilst switch 320 is closed driving and the X plate 100.1 of the key is being driven to a voltage V. At time t6 the switch 310 is then opened floating $Y_{BS}$ Whilst the noise measurement capacitor and signal plus noise measurement capacitor 302, 304 are being driven, $Y_A$ is floating with a logical low (0) being applied to the control input 314. However, at time t7 the logical input 314 to the switch 308 goes high (1) therefore closing the switch 308 thus grounding $Y_A$ and presenting voltages at the output of the measurement circuit for the noise between $Y_A$ and $Y_{BN}$ and the signal plus noise between $Y_A$ and $Y_{BS}$ as shown in the timing diagrams 348.2, 350.2. Thus the second dwell periods between t9 and t10 and t11 and t12 occur in the same way as the first dwell period and so these will not be described again.

Figure 12:
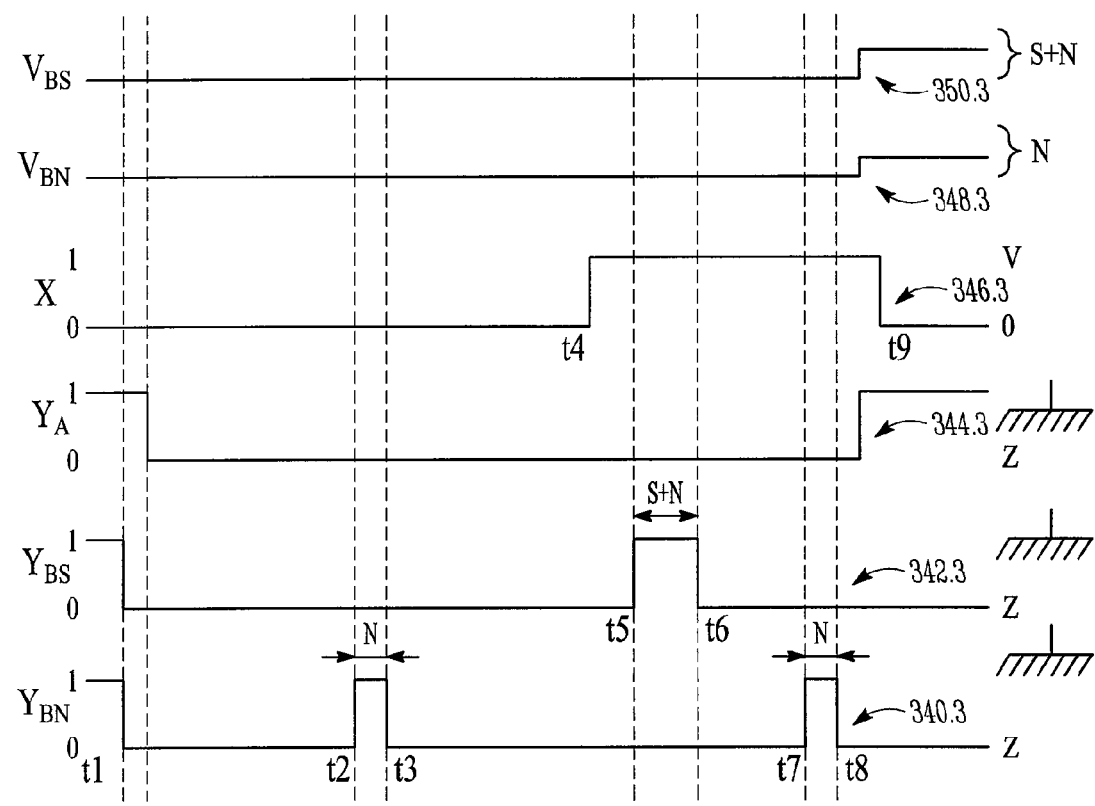
FIG. 12 is a graphical representation of a timing diagram providing a further example operation of the measurement circuit shown in FIG. 9.

A further example operation of the touch sensor shown in FIG. 9 is provided in FIG. 12. Timing diagrams are again provided for switch 306, 310 and 308 as well as the control input of the switch 320, 340.3, 342.3, 344.3, 346.3. Also shown are timing diagrams for the output voltage $V_{BN}$ between $Y_A$ and $Y_{BN}$ 348.3 and the output voltage $V_{BS}$ 350.3 between $Y_A$ and $Y_{BS}$. For the example shown in FIG. 12, there are two noise measurement periods and one signal plus noise measurement period. Furthermore, as can be observed in FIG. 12 the duration of the noise measurement periods between time t2 and t3 and t7 and t8 are half the signal plus noise measurement period between t5 and t6. The operation of the touch sensor as represented by the timing diagrams in FIG. 12 corresponds to those shown in FIGS. 11 and 12 and so for brevity the description will not be repeated. However, as can be seen the second noise measurement period between t7 and t8 can be performed whilst the X plate is driven between t5 and t9. In contrast, the first noise measurement period between times t2 and t3 occurs when the X plate is grounded.

Figure 13:
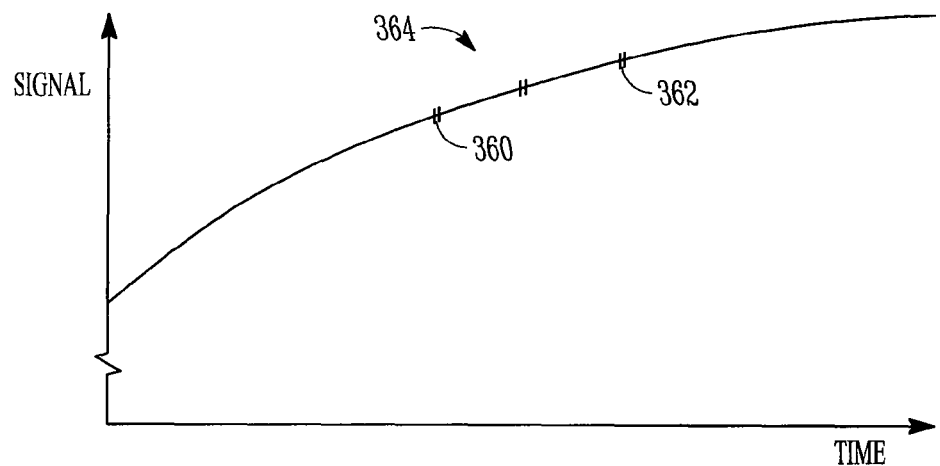
FIG. 13 is a graphical representation of a plot of signal strength with respect to time illustrating the operation of the measurement circuit of FIG. 9 according to the timing diagram of FIG. 12.

The example shown in FIG. 12 represents an arrangement in which the signal plus noise measurement is made either side of two noise measurements. This arrangement has an advantage of producing a better average noise value if for example the noise signal is varying between a time at which the measurements are taken. For example, as shown in FIG. 13 which provides a plot of signal value against time for charge induced on the key 10.1, the signal level is rising with time as a result of the low frequency noise. Therefore, by taking the noise measurement two points either side of the signal measurement 360 and 362 the signal plus noise measurement 364 and averaging the two noise measurements 360, 362, a better representation of the average noise present during the signal plus noise measurement period 364 is provided, therefore providing a more accurate measurement of the signal when the noise measurement is subtracted from the signal.

Figure 14:
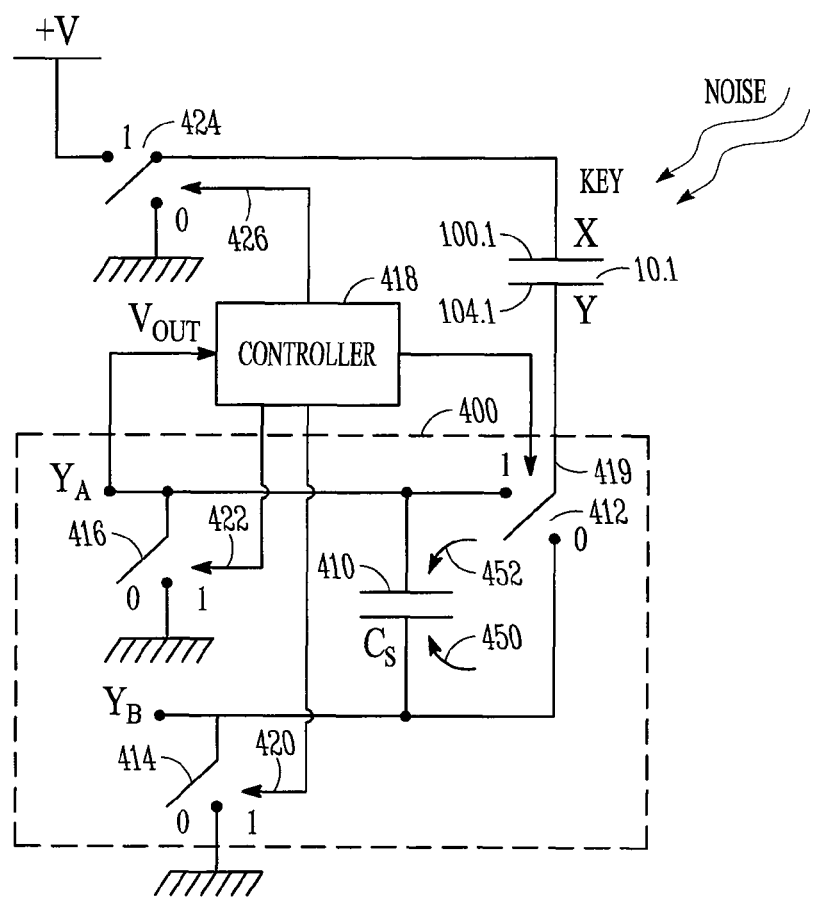
FIG. 14 is a schematic block diagram of a touch sensor including a second example of a measurement circuit according to the present technique.

FIG. 14 provides a further example of a touch sensor which is arranged to include a measurement circuit for canceling or at least reducing the effect of sinusoidal or sinusoidal noise. In FIG. 14 a measurement circuit 400 includes a single measurement capacitor 410. The measurement circuit 400 also includes switches 412, 414, 416. A logical control input 419, 420, 422, 426 of each of the switches 412, 414, 416, 424 is connected to a micro-controller 418. Again, a convention has been adopted to the effect that the switches 412, 414, 416 are closed with a logical "1" and open with a logical "0" on each of the control inputs 412, 420, 422. As before, a drive circuit is represented by a switch 424 which has a logical control input 426 connected to the micro-controller 418.

Figure 15:
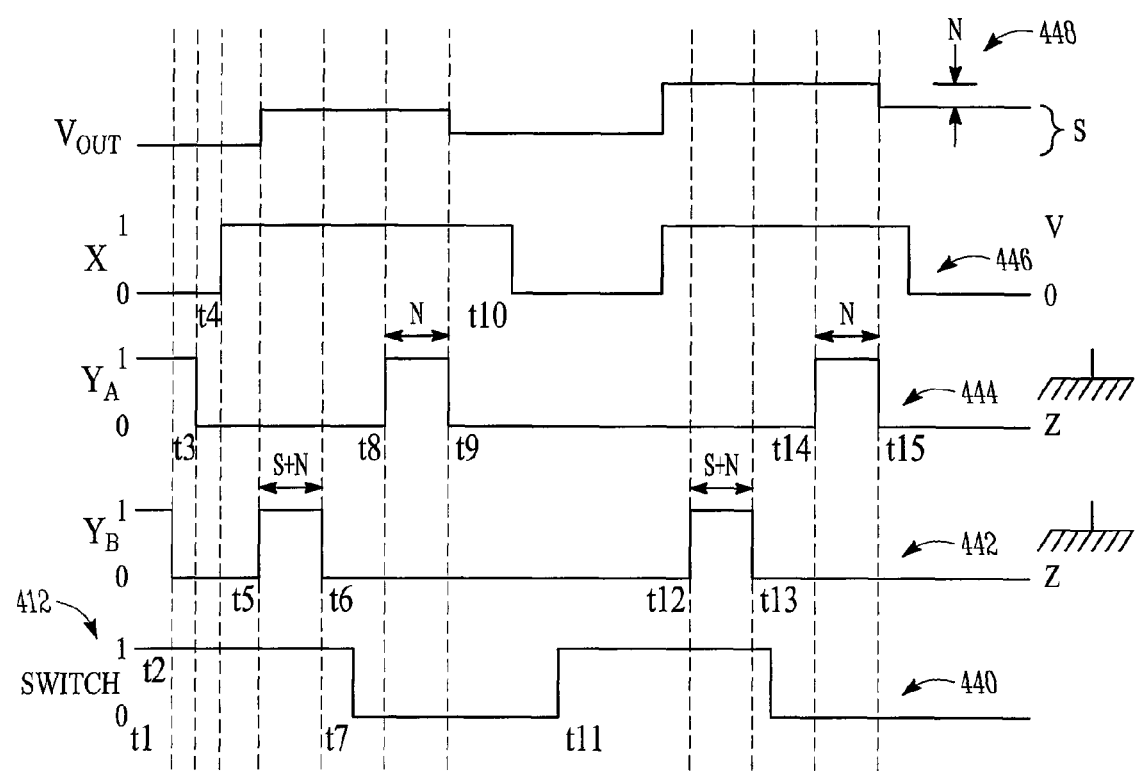
FIG. 15 is a graphical representation of a timing diagram illustrating an example operation of the measurement circuit shown in FIG. 14.

A set of timing diagrams are shown in FIG. 15 to represent the operation of the touch sensor shown in FIG. 14. A first diagram 440 represents the control input 480 on the switch 412, a second timing diagram 442 represents the control input on the switch 414, a third timing diagram 444 represents the control input 422 on the switch 416 and a fourth timing diagram 446 represents the control input 426 to the switch 424 forming the drive circuit for the X plate of the key 10.1. Finally a fifth timing diagram represents the output voltage measured between the point $Y_A$ and ground.

In contrast to the operation of the circuit shown in FIG. 9, the circuit shown in FIG. 14 only uses a single measurement capacitor 410 to measure both noise and signal plus noise.

A switch 412 is provided to reverse the direction of the flow of the charge from the Y plate of the key 104.1. Turning to the timing diagrams in FIG. 15 at time t1 an initialization occurs in which the switches 414, 416 are closed grounding $Y_A$ and $Y_B$. At this point the X plate is set to ground and the switch 412 is closed connecting the Y plate 104.1 to $Y_A$, that is one side of the capacitor 410. At time t2, the switch 414 is open thereby floating $Y_B$ and at time t3 the switch 416 is also open thereby floating $Y_A$. At time t4 the X plate is driven by closing switch 424 and connecting the X plate to the drive voltage V with the switch 412 closed, and at time t5 the control input 420 on switch 414 is set to a logical high closing the switch 414 thereby grounding $Y_B$, which drives charge from the Y plate 104.1. Thus, as for the previous examples the X plate is pre-charged. Between t5 and t6 charge is transferred from the Y plate to the measurement capacitor 410 as for the operation of the other measurement circuits described above.

At t7, the control switch 412 is opened with a logical zero (0) applied to the control input 418, thereby connecting the Y plate 104.1 to the other side of the measurement capacitor 410. At t8 the switch 416 is closed thereby grounding $Y_A$ and driving charge, which results from noise into a second side of the measurement capacitor 410, than the first side of the measurement capacitor 410 on to which charge was transferred when the signal plus noise was measured as represented by arrows 450, 452. Thus, between t8 and t9 charge as a result of noise is driven onto the other side of the measurement capacitor. At t10 the X plate is connected to ground to complete one measurement cycle.

At t11 the control switch 412 is again closed connecting $Y_A$ and the first side of the measuring capacitor 410 to the Y plate 104.1. As such, between t12 and t13 and t14 and t15 a second dwell period is provided for the measurement of signal plus noise and noise.

Referring to the timing diagram for the output voltage 448, it can be seen that at t5, after $Y_B$ is again floated an output voltage appears as a result of the signal plus noise on the measuring capacitor 410. During the dwell period for the measurement of noise between times t8 and t9, because the control switch 412 is at a logical zero (0), the noise causes charge from the Y plate 104.1 to flow in the opposite direction to that of the signal plus noise into the measurement capacitor 412 with a result of reducing the voltage by an amount corresponding to the amount of noise. As a result noise is subtracted from the measurement so that after the first dwell time a first indication of the signal value is provided at the output $V_{OUT}$. Again after a second dwell period, corresponding to a second measurement cycle, the signal plus noise is again transferred to the measuring capacitor and noise is arranged to remove the charge as a result of reversal of the switch 412 so that a final output voltage $V_{OUT}$ at $Y_A$ corresponds to the value of the signal.

Although the noise is shown in FIG. 15 to have increased the signal plus noise measured charge, and is therefore subtracted from the signal plus noise, to form an estimate of the signal without the noise, it will be appreciated that this is just an example. As will be appreciated, the noise may induce a negative charge onto the measurement capacitor and so the signal plus noise measurement may be increased, when the noise is taken into account.

The example embodiment described with reference to FIG. 14 has an advantage in reducing a number of pin outs provided on the measurement circuit 400 compared to that of the measurement circuit 300, which can assist in deploying the measurement circuit on a system where a number of output pins is limited. Furthermore, the processing, which is required to subtract the noise measurement from the signal measurement does not need to be implemented within the micro-controller since this is formed as a result of the charge transfer provided by the measurement circuit 400 in the analogue domain.

Figure 16:
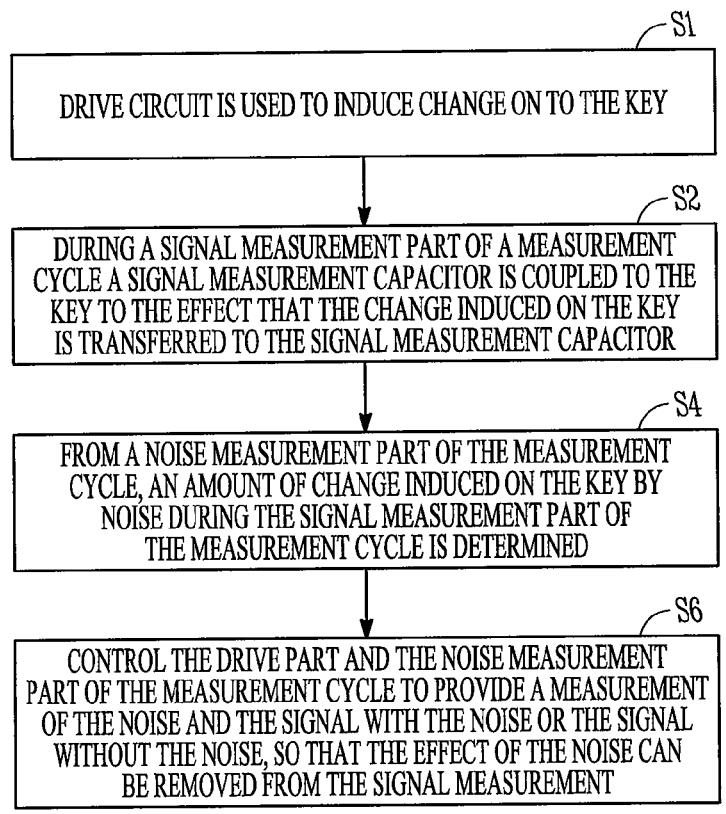
FIG. 16 is a flow diagram illustrating an example operation of the present technique to measure the signal and the noise induced on a capacitively charged key.
Figure 17:
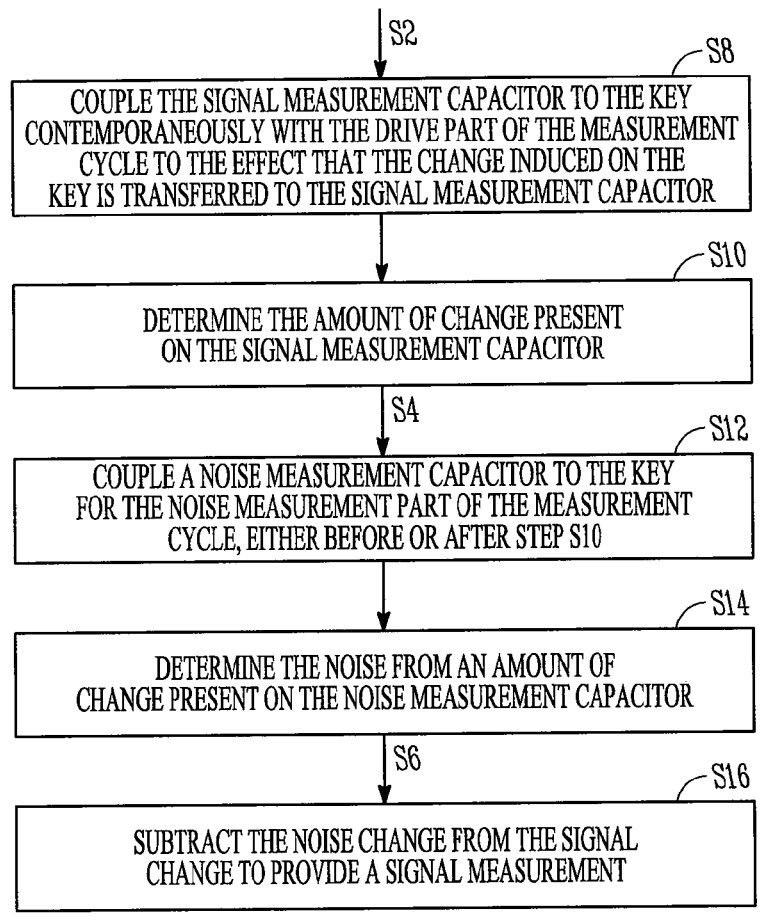
FIG. 17 is a flow diagram illustrating an example of the signal measurement part and the noise measurement part of the flow diagram of FIG. 16.
Figure 18:
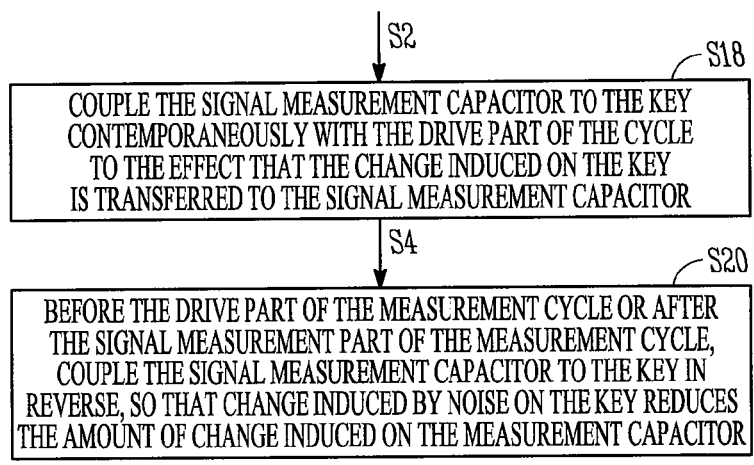
FIG. 18 is a flow diagram illustrating another of the signal measurement part and the noise measurement part of the flow diagram of FIG. 16.

An example illustration of the operation of the present technique is provided in FIGS. 16, 17 and 18. FIG. 16 provides an illustration of the general method of sensing the presence of a body from a change in an amount of charge present on a capacitively charged key, according to an example embodiment. The steps of the method shown in FIG. 16 are summarized as follows:

S1: Charge is induced onto the key during a drive part of a measurement cycle.

S2: A signal measurement capacitor is then coupled to the key during a signal measurement part of the measurement cycle to the effect that the charge induced on the key during the drive part of the measurement cycle is transferred to the signal measurement capacitor.

S4: From a noise measurement part of the measurement cycle an amount of charge induced on the key by noise during the signal measurement part of the measurement cycle is determined, and S6: The drive part, the signal measurement part and the noise measurement parts of the cycle are controlled to provide the charge sensing circuit with a measurement of the signal from which the noise induced on the key has been or can be substantially cancelled.

As shown in FIG. 17, one example of the step S2 includes

S8: coupling the signal measurement capacitor to the key contemporaneously with the drive part of the measurement cycle to the effect that the charge induced on the key is transferred to the signal measurement capacitor at the end of the signal measurement part of the measurement cycle, and S10: determining an amount of charge present on the signal measurement capacitor.

Then an example of the operations of step S4, through which an amount of charge induced on the key by noise during the noise measurement part of the measurement cycle, includes S12: coupling a noise measurement capacitor to the key for the noise measurement part of the measurement cycle either after the charge induced by the key has been transferred to the signal measurement capacitor or before the charge has been induced on the key during the drive part of the measurement cycle, and S14: determining an amount of charge induced on the noise measurement capacitor.

Then the step S6, would include step S16: subtracting the noise measurement provided by the charge on the noise measurement capacitor from the signal measurement provided by the charge on the signal measurement capacitor.

As shown in FIG. 18, another example of the operation of step S2, through which an amount of charge induced on the key by the signal, may include S18: coupling the signal measurement capacitor to the key contemporaneously with the drive part of the cycle to the effect that the charge induced on the key is transferred to the signal measurement capacitor. Furthermore, for this example, another example of step S4 for determining from the noise measurement part of the measurement cycle the amount of charge induced on the key by the noise, may include S20: either before the drive part of the measurement cycle or after the signal measurement part of the measurement cycle, coupling the signal measurement capacitor to the key in reverse so that charge induced by noise on the key reduces the amount of charge induced on the measurement capacitor during the signal measurement part of the cycle.

Further aspects and features of the present invention are defined in the appended claims. Various modifications may be made to the example embodiments described above without departing from the scope of the present invention. In particular, although the above description has been made with reference to a matrix touch sensor which includes a key having an X plate and a Y plate where the X plate is driven and charge is measured on the Y plate, the present invention also finds application where only a single plate is provided in the touch sensor which is first charged in a charge cycle and then discharged in a measurement cycle such as that disclosed in WO-97/23738.

The invention claimed is:

1. A method comprising:
inducing charge onto a capacitively charged key using a drive signal during a drive part of a measurement cycle;
transferring, during a signal measurement part of the measurement cycle, charge induced on the key during the drive part of the measurement cycle to a signal measurement capacitor;
transferring, during a first noise measurement part of the measurement cycle, charge induced on the key due to noise to a noise measurement capacitor; and
determining an amount of charge induced on the key due to noise during the signal measurement part of the measurement cycle based on an amount of charge transferred to the noise measurement capacitor during the first noise measurement part of the measurement cycle, resulting in a determined noise value.

2. The method of claim 1, wherein, within the measurement cycle, the signal measurement part of the measurement cycle is substantially equal in duration to the first noise measurement part of the measurement cycle.

3. The method of claim 1, wherein, within the measurement cycle, the drive part of the measurement cycle, begins before the signal measurement part of the measurement cycle, such that the key is pre-charged before the charge induced on the key is transferred to the signal measurement capacitor.

4. The method of claim 1, wherein, within the measurement cycle, the signal measurement part of the measurement cycle occurs prior to the first noise measurement part of the measurement cycle.

5. The method of claim 1, wherein, within the measurement cycle, the first noise measurement part of the measurement cycle occurs prior to the signal measurement part of the measurement cycle.

6. The method of claim 1, wherein, within the measurement cycle, the signal measurement part of the measurement cycle and the first noise measurement part of the measurement cycle both occur during the drive part of the measurement cycle.

7. The method of claim 1, wherein determining an amount of charge induced on the key due to noise during the signal measurement part of the measurement cycle based on an amount of charge transferred to the noise measurement capacitor comprises measuring an amount of charge transferred to the noise measurement capacitor during the first noise measurement part of the measurement cycle.

8. The method of claim 1, wherein determining an amount of charge induced on the key due to noise during the signal measurement part of the measurement cycle based on an amount of charge transferred to the noise measurement capacitor comprises:
discharging the noise measurement capacitor; and
determining an amount of time required to discharge the noise measurement capacitor.

9. The method of claim 1, further comprising transferring, during a second noise measurement part of the measurement cycle, charge induced on the key due to noise to the noise measurement capacitor, the second noise measurement part of the measurement cycle not occurring at the same time as the first noise measurement part of the measurement cycle and not occurring at the same time as the signal measurement part of the measurement cycle.

10. The method of claim 9, wherein, within the measurement cycle, a combined duration of the first noise measurement part of the measurement cycle and the second noise measurement part of the measurement cycle is substantially equal to a duration of the signal measurement part of the measurement cycle.

11. The method of claim 9, wherein:
within the measurement cycle, the second noise measurement part of the measurement cycle occurs prior to the signal measurement part of the measurement cycle; and
within the measurement cycle, the signal measurement part of the measurement cycle occurs prior to the first noise measurement part of the measurement cycle.

12. The method of claim 9, wherein:
within the measurement cycle, the signal measurement part of the measurement cycle and the first noise measurement part of the measurement cycle both occur during the drive part of the measurement cycle; and
within the measurement cycle, the second noise measurement part of the measurement cycle does not occur during the drive part of the measurement cycle.

13. The method of claim 9, wherein determining an amount of charge induced on the key due to noise during the signal measurement part of the measurement cycle based on an amount of charge transferred to the noise measurement capacitor comprises:
measuring a first amount of charge transferred to the noise measurement capacitor during the first noise measurement part of the measurement cycle; and
measuring a second amount of charge transferred to the noise measurement capacitor during the second noise measurement part of the measurement cycle.

14. The method of claim 1, wherein:
within the measurement cycle, the signal measurement part of the measurement cycle occurs during the drive part of the measurement cycle; and
within the measurement cycle, the first noise measurement part of the measurement cycle does not occur during the drive part of the measurement cycle.

15. An apparatus, comprising:
a driving circuit operable to induce charge onto a capacitively charged key,
a charge sensing circuit comprising:
a signal measurement capacitor; and
a noise measurement capacitor; and
a controller, the controller being operable to perform operations comprising:
controlling the driving circuit to induce charge onto the key during a drive part of a measurement cycle;
controlling the charge sensing circuit to transfer, during a signal measurement part of the measurement cycle, charge induced on the key during the drive part of the measurement cycle to the signal measurement capacitor;
controlling the charge sensing circuit to transfer, during a first noise measurement part of the measurement cycle, charge induced on the key due to noise to the noise measurement capacitor; and determining an amount of charge induced on the key due to noise during the signal measurement part of the measurement cycle based on an amount of charge transferred to the noise measurement capacitor during the first noise measurement part of the measurement cycle, resulting in a determined noise value.

16. A controller operable to perform operations comprising:

controlling a driving circuit to induce charge onto a capacitively charged key during a drive part of a measurement cycle;

controlling a charge sensing circuit, the charge sensing circuit comprising a signal measurement capacitor and a noise measurement capacitor, to transfer, during a signal measurement part of the measurement cycle, charge induced on the key during the drive part of the measurement cycle to the signal measurement capacitor;

controlling the charge sensing circuit to transfer, during a first noise measurement part of the measurement cycle, charge induced on the key due to noise to the noise measurement capacitor; and determining an amount of charge induced on the key due to noise during the signal measurement part of the measurement cycle based on an amount of charge transferred to the noise measurement capacitor during the signal measurement part of the measurement cycle, resulting in a determined noise value.

17. The controller of claim 16, wherein, within the measurement cycle, the signal measurement part of the measurement cycle is substantially equal in duration to the first noise measurement part of the measurement cycle.

18. The controller of claim 16, wherein, within the measurement cycle, the drive part of the measurement cycle begins before the signal measurement part of the measurement cycle, such that the key is pre-charged before the charge induced on the key is transferred to the signal measurement capacitor.

19. The controller of claim 16, wherein, within the measurement cycle, the signal measurement part of the measurement cycle occurs prior to the first noise measurement part of the measurement cycle.

20. The controller of claim 16, wherein, within the measurement cycle, the first noise measurement part of the measurement cycle occurs prior to the signal measurement part of the measurement cycle.

21. The controller of claim 16, wherein, within the measurement cycle, the signal measurement part of the measurement cycle and the first noise measurement part of the measurement cycle both occur during the drive part of the measurement cycle.

22. The controller of claim 16, wherein determining an amount of charge induced on the key due to noise during the signal measurement part of the measurement cycle based on an amount of charge transferred to the noise measurement capacitor comprises measuring an amount of charge transferred to the noise measurement capacitor during the first noise measurement part of the measurement cycle.

23. The controller of claim 16, wherein determining an amount of charge induced on the key due to noise during the signal measurement part of the measurement cycle based on an amount of charge transferred to the noise measurement capacitor comprises:

controlling the charge sensing circuit to discharge the noise measurement capacitor; and determining an amount of time required to discharge the noise measurement capacitor.

24. The controller of claim 16, the controller operable to perform operations further comprising controlling the charge sensing circuit to transfer, during a second noise measurement part of the measurement cycle, charge induced on the key due to noise to the noise measurement capacitor, the second noise measurement part of the measurement cycle not occurring at the same time as the first noise measurement part of the measurement cycle and not occurring at the same time as the signal measurement part of the measurement cycle.

25. The controller of claim 24, wherein, within the measurement cycle, a combined duration of the first noise measurement part of the measurement cycle and the second noise measurement part of the measurement cycle is substantially equal to a duration of the signal measurement part of the measurement cycle.

26. The controller of claim 24, wherein:

within the measurement cycle, the second noise measurement part of the measurement cycle occurs prior to the signal measurement part of the measurement cycle; and within the measurement cycle, the signal measurement part of the measurement cycle occurs prior to the first noise measurement part of the measurement cycle.

27. The controller of claim 24, wherein:

within the measurement cycle, the signal measurement part of the measurement cycle and the first noise measurement part of the measurement cycle both occur during the drive part of the measurement cycle; and within the measurement cycle, the second noise measurement part of the measurement cycle does not occur during the drive part of the measurement cycle.

28. The controller of claim 24, wherein determining an amount of charge induced on the key due to noise during the signal measurement part of the measurement cycle based on an amount of charge transferred to the noise measurement capacitor comprises:

measuring a first amount of charge transferred to the noise measurement capacitor during the first noise measurement part of the measurement cycle; and measuring a second amount of charge transferred to the noise measurement capacitor during the second noise measurement part of the measurement cycle.

29. The controller of claim 28, wherein determining an amount of charge induced on the key due to noise during the signal measurement part of the measurement cycle based on an amount of charge transferred to the noise measurement capacitor further comprises averaging the first amount of charge and the second amount of charge.

30. A device comprising:

a touch sensor comprising a capacitively charged key; and a controller operable to perform operations comprising:

controlling a driving circuit to induce charge onto the capacitively charged key during a drive part of a measurement cycle;

controlling a charge sensing circuit, the charge sensing circuit comprising a signal measurement capacitor and a noise measurement capacitor, to transfer, during a signal measurement part of the measurement cycle, charge induced on the key during the drive part of the measurement cycle to the signal measurement capacitor;

controlling the charge sensing circuit to transfer, during a first noise measurement part of the measurement cycle, charge induced on the key due to noise to the noise measurement capacitor; and determining an amount of charge induced on the key due to noise during the signal measurement part of the measurement cycle based on an amount of charge transferred to the noise measurement capacitor during the first noise measurement part of the measurement cycle, resulting in a determined noise value.

* * * * *